United States Patent
Beteille et al.

(10) Patent No.: US 7,604,717 B2
(45) Date of Patent: Oct. 20, 2009

(54) ELECTROCHEMICAL DEVICE

(75) Inventors: Fabien Beteille, Paris (FR);
Jean-Christophe Giron, Paris (FR);
Marc Vermeersch, Namur (BE)

(73) Assignee: Saint-Gobain Glass France, Courbevoie (FR)

( * ) Notice: Subject to any disclaimer, the term of this patent is extended or adjusted under 35 U.S.C. 154(b) by 150 days.

(21) Appl. No.: 10/900,110

(22) Filed: Jul. 28, 2004

(65) Prior Publication Data

US 2005/0008937 A1    Jan. 13, 2005

Related U.S. Application Data

(62) Division of application No. 10/226,346, filed on Aug. 23, 2002, now abandoned, which is a division of application No. 09/743,812, filed as application No. PCT/FR00/01388 on May 19, 2000, now abandoned.

(30) Foreign Application Priority Data

May 20, 1999    (FR)    .................................. 99 06408

(51) Int. Cl.
*C23C 14/34*    (2006.01)
*C23C 14/35*    (2006.01)
*G02F 1/1335*    (2006.01)
*G02B 5/20*    (2006.01)

(52) U.S. Cl. ........................... 204/192.26; 204/192.15; 204/298.13; 204/298.16; 359/273; 359/321

(58) Field of Classification Search .................. 429/223; 423/594.3, 594.5, 594.6; 359/265–273, 321; 204/192.15, 192.26, 298.12, 298.13, 298.16
See application file for complete search history.

(56) References Cited

U.S. PATENT DOCUMENTS

| | | | |
|---|---|---|---|
| 4,094,761 A | | 6/1978 | Wilson |
| 4,476,151 A | | 10/1984 | Keller et al. |
| 4,584,085 A | * | 4/1986 | Beaver et al. .......... 204/290.09 |
| 4,769,086 A | | 9/1988 | Tanner et al. |
| 4,832,809 A | | 5/1989 | Hodes et al. |
| 4,890,035 A | | 12/1989 | Prein et al. |
| 5,030,331 A | * | 7/1991 | Sato ........................... 205/107 |
| 5,741,406 A | | 4/1998 | Barnett et al. |
| 5,798,134 A | * | 8/1998 | Sato et al. ................. 427/126.6 |
| 5,831,760 A | * | 11/1998 | Hashimoto et al. .......... 359/273 |
| 5,981,092 A | * | 11/1999 | Arai et al. .................... 428/690 |
| 5,985,486 A | * | 11/1999 | Giron .......................... 429/188 |

FOREIGN PATENT DOCUMENTS

| | | |
|---|---|---|
| DE | 196 40 515 | 4/1998 |
| JP | 59 019 307 A | 1/1984 |
| JP | 62089863 A | 4/1987 |
| JP | 03 171 420 A | 7/1991 |
| JP | 10 072 689 A | 3/1998 |
| JP | 11024058 A * | 1/1999 |
| JP | 2000 169 923 A | 6/2000 |
| WO | WO 98/14824 | 4/1998 |

OTHER PUBLICATIONS

A. Azens et al. "Sputter-deposited nickel oxide for electrochromic applications", Solid State Ionics, vols. 113-115, Dec. 1, 1998, pp. 449-456.*
J. Gordon H. Mathew et al. "Large area electrochromics for architechtural applicaitons", Journal of Non-Crystalline Solids, vol. 218, Sep. 2, 1997, pp. 342-346.*
K. Murai et al. "Electrochromism in nickel oxide films prepared by plasma oxidation of nickel-carbon composite films", Solid State Ionics, vols. 86-88, Part 2, Jul. 1996, pp. 955-958.*
S.H. Lee et al. "Electrochromic behavior of Ni-W oxide electrodes", Solar Energy Materials and Solar Cells, vol. 39, Issues 2-4, Dec. 1995, pp. 155-166.*
Y. Sato et al. "Electrochromic properties of spin-coated nickel oxide films", Solid State Ionics, vols. 113-115, Dec. 1, 1998, pp. 443-447.*
Hutchins et al. "The Electrochromic Behaviour of Tin-Nickel Oxide" Solar Energy Materials and Solar Cells 54 (1998) pp. 75-84.*
Platzer et al. "The Thermal Performance of Advanced Glazing Materials", Renewable Energy, vol. 8, Issues 1-4, May-Aug. 1996, pp. 540-545.*
Zou et al. "Deposition of multiphase molybdate thin films by reactive sputtering", Thin Solid Films Vo. 324, Issues 1-2, Jul. 1, 1998, pp. 52-62.*
U.S. Appl. No. 09/743,812, filed Apr. 25, 2001, Beteille, et al.
Derwent Abstract 1995-244815 published Jan. 1995.
Patent Abstracts of Japan vol. 1998, No. 14, Dec. 31, 1998, JP 10 251848, Sep. 22, 1998.
Patent Abstracts of Japan vol. 1998, No. 1, Jan. 30, 1998, JP 09 249962, Sep. 22, 1997.

* cited by examiner

*Primary Examiner*—Gregg Cantelmo
(74) *Attorney, Agent, or Firm*—Oblon, Spivak, McClelland, Maier & Neustadt, L.L.P.

(57) ABSTRACT

The invention relates to an essentially metallic target of a cathodic sputtering device, in particular a magnetic-field-assisted device, the said target mainly comprising nickel alloyed with at least one other minor element in order to reduce or eliminate its ferromagnetism. The invention also relates to the use of the target to manufacture an electrochromic material with anodic colourization as a thin layer based on alloyed nickel oxide.

13 Claims, No Drawings

ELECTROCHEMICAL DEVICE

CROSS-REFERENCE TO RELATED APPLICATIONS

This application is a divisional of abandoned application Ser. No. 10/226,346, filed Aug. 23, 2002, which is a divisional of abandoned application Ser. No. 09/743,812, filed Apr. 25, 2001, which is the National Stage of International Application PCT/FR00/01388, filed May 19, 2000.

BACKGROUND OF THE INVENTION

1. Field of the Invention

The invention relates to electrochemical devices, and in particular electrically controllable systems with variable optical and/or energetic properties of the electrochromic glazing or mirror type.

2. Discussion of the Background

In a known manner, electrochromic systems comprise a layer of an electrochromic material capable of reversibly and simultaneously inserting ions and electrons and whose oxidation states corresponding to the inserted and de-inserted inserted states are of distinct colourization, one of the states presenting greater light transmission than the other, the insertion or de-insertion reaction being controlled by a suitable electrical supply. The electrochromic material, usually based on tungsten oxide, must thus be placed in contact with a source of electrons such as a transparent electrically conductive layer and a source of ions (cations or anions) such as an ionic conductive electrolyte.

Moreover, it is known that in order to ensure at least a hundred switching operations, the layer of electrochromic material must be combined with a counterelectrode also capable of reversibly inserting ions, symmetrically relative to the layer of electrochromic material, such that, macroscopically, the electrolyte appear as a simple medium of ions.

The counterelectrode must consist of a colour-neutral layer, or a layer which is at least transparent or only slightly coloured when the electrochromic layer is in the coloured state. Since tungsten oxide is a cathodic electrochromic material, i.e. its coloured state corresponds to the most reduced state, an anodic electrochromic material based on nickel oxide or iridium oxide is generally used for the counterelectrode. It has also been proposed to use a material which is optically neutral in the oxidation states concerned, such as, for example, cerium oxide or organic materials such as electron-conducting polymers (polyaniline, etc.) or Prussian blue.

A description of such systems will be found, for example, in European patents EP-A-0 338 376, EP-A-0 408 427, EP-A-0 575 207 and EP-A-0 628 849.

These systems can currently be classified in two categories, depending on the type of electrolyte they use:
  either the electrolyte is in the form of a polymer or a gel, for example a proton-conducting polymer such as those disclosed in European patents EP-A-0 253 713 and EP-A-0 670 346, or a lithium-ion-conducting polymer such as those disclosed in patents EP-A-0 382 623, EP-A-0 518 754 or EP-A-0 532 408,
  or the electrolyte is a mineral layer, which conducts ions but is electronically insulating, such systems being referred to as "all-solid" electrochromic systems. For the description of an "all-solid" electrochromic system, reference may be made to European patent applications EP-A-0 867 752 and EP-A-0 831 360.

The present invention is directed most particularly towards obtaining layers of anodic electrochromic material based on nickel oxide which are capable of forming a part of such electrochromic systems.

As mentioned above, nickel oxide is known to have such a property, and is described as such in particular in patent EP-0 373 020 B1.

However, this material has a drawback: certain difficulties arise in obtaining it in the form of a thin layer by a standard vacuum deposition process, magnetic-field-assisted reactive cathodic sputtering: since nickel is ferromagnetic, using a standard nickel target and a standard magnet, the magnetic field developed at the surface of the target is weak, resulting in a low deposition rate and mediocre exploitation of the target.

This type of material was also studied in patent application WO 98/14824: in an application to electrochromic mirrors, studies were carried out on nickel oxides alloyed with another metal such as vanadium, chromium, manganese, iron or cobalt, this change of composition being said to improve the functionality of the mirror, and in particular to give it a more uniform colour.

However, introducing other metals into the nickel oxide in this way appears to entail risks as regards the optical and electrochemical properties of the nickel oxide. Thus, it may be feared, for example, that the introduction of vanadium and chromium, the oxides of which absorb in the visible region, tends to make the nickel oxide more absorbent and, consequently, tends to reduce the light transmission value of the active system as a whole when it is in the decolourized state. Similarly, the introduction of manganese, iron and cobalt may tend to lower the durability of the layer and thus of the active system as a whole.

SUMMARY OF THE INVENTION

The aim of the invention is thus to remedy these drawbacks, in particular by proposing a new method for producing nickel oxide with anodic electrochromic properties, this production method in particular being faster, more economically viable and simpler to carry out, without otherwise compromising the desired functionality in the nickel oxide. This "functionality" is directed in particular towards its stability, its durability of functioning in an electrochromic system, most particularly of $H^+$-conducting type or $Li^+$-conducting type and of "all-solid" type, and its transparency in the decolourized state, when it is in a thin layer.

DESCRIPTION OF THE PREFERRED EMBODIMENTS

A subject of the invention is firstly an essentially metallic target of a cathodic sputtering, device, preferably a magnetic-field-assisted device, in particular in a reactive atmosphere in the presence of oxygen to obtain the corresponding metal oxide as a thin layer, the said target mainly comprising nickel and being alloyed with at least one other minor element in order to reduce or even eliminate its ferromagnetic nature, while at the same time preserving as well possible the optical and/or electrochemical properties of the alloyed nickel oxide layer obtained from this target.

Specifically, the invention thus makes an advantageous compromise by making it possible to obtain, by reactive sputtering, layers based on nickel oxide in much higher rates and better economic viability of the target, without degrading their functionality, by adding carefully selected elements to the target. The maximum effect in terms of gain in production efficiency is reached by completely eliminating the ferromagnetic nature of the nickel, but it may be chosen simply to decrease it, by appropriately modifying the chemical nature of the element added and the amount of this element incorporated into the target.

Generally, the proportion of this or these minor element(s) in the alloy remains not more than 20 atom % relative to the combined nickel+minor element(s), preferably especially not more than 18%, and for example between 3% and 15%.

For the purposes of the invention, the term "nickel oxide" means nickel oxide which may be hydrated and/or hydroxylated and or protonated (and optionally nitride-treated) to varying degrees. Similarly, the stoichiometry between the nickel and the oxygen may generally vary in an Ni/O ratio ranging between 1 and ½. However, it may be considered that the nickel is generally predominantly in oxidation state +2.

Different variants are possible as regards the chemical nature of the target, these being alternative or cumulative variants.

A first variant consists in this minor element (denoted hereinbelow by the term "additive" for simplicity) being a metal whose oxide is an electrochromic material with anodic colourization. It may in particular be at least one of the following metals: Ir, Ru, Rh. Ideally, this is moreover most particularly the case for iridium, the corresponding oxides have an operating voltage range which is identical or close to that of nickel oxide: far from disrupting the functionality of the nickel oxide, the additive makes it possible to keep it intact and possibly even to increase its reversible ion-inserting capacity. It may even, in this case, be envisaged to reduce the thickness of the layer while still keeping the same level of optical/energetic modification as that of a thicker layer of nickel oxide.

A second variant consists in the additive being a metal whose oxide is an electrochromic material with cathodic colourization. It may be in particular at least one of the following metals: Mo, W, Re, Sn, In, Bi. It may appear paradoxical and liable to result in disruptions to introduce such a material into the nickel oxide in this way. In fact, it has been found that the abovementioned metal oxides have cathodic ion-inserting capacities in operating voltage ranges that are well beyond the potentials reached by the nickel oxide used as anodic electrochromic material. Consequently, these additives which are effectively found in oxidized form in the nickel oxide are inert and remain colourless when the nickel oxide undergoes colour variations by being placed under tension; these additives are neutralized when the active system is functioning and do not reduce its level of light: transmission in the decolourized state. On the other hand, their presence tends to reduce the ion-inserting capacity of the layer as a whole, and it is then possible, if necessary, to increase its thickness slightly to compensate for this phenomenon, this measure also being conceivable for all the variants which follow.

A third variant consists in the additive being made of a metal, an alkaline-earth metal or a semiconductor whose hydrated and/or hydroxylated oxide is a proton conductor. It may be in particular at least one of the following elements: Ta, Zn, Zr, Al, Si, Sb, U, Be, Mg, Ca, Y. These materials in oxidized form have no noteworthy electrochromic properties. On the other hand, they are known for their ability to serve as a material which is capable of serving as proton-conducting electrolyte in electrochromic systems: although they do not intrinsically promote the electrochromic property of nickel oxide, they at any rate have no negative impact on its functionality and tend rather to promote the stability of the hydroxylation/hydration which may be desired for the nickel oxide. Needless to say, it should be noted that this variant is essentially directed towards electrochromic systems which function by reversible insertion of protons, $H^+$.

A fourth variant consists in the additive being an element whose oxide is hygroscopic, this characteristic being advantageous here also when the electrochromic system concerned is one functioning by insertion/de-insertion of ions, and most particularly of cations such as protons. These additives are typically alkali metals, in particular Li, Na, K, Rb, Cs. When in oxidized form in the nickel oxide, it is found that these materials improve the stability of the nickel oxide when it acts as an anodic electrochromic material in an electrochromic system, most particularly when the nickel oxide is hydrated/hydroxylated, quite probably by promoting the retention of the water contained in the layer.

The preferred embodiments of the target of the invention are the alloys Ni/Si, Ni/Al, Ni/Sn, Ni/W, Ni/Zn, Ni/Ta and Ni/Y, the first three alloys being the cheapest to manufacture. The alloy targets are manufactured in a manner which is known in this field of vacuum deposition, for example by hot sintering of the metal powders to the alloyed. Indications regarding the atomic proportions of some of the additives relative to the whole alloy considered are given below, the proportions being adjusted such that the ferromagnetism of the target is completely eliminated:

for an Ni/W alloy, it is necessary to provide about 7 atom % of tungsten, W, for an Ni/Zn alloy, it is necessary to provide about 18 atom % of zinc, Zn, for an Ni/Ta alloy, it is necessary to provide about 9 atom % of tantalum, Ta, for an Ni/Sn alloy, it is necessary to provide about 8 atom % of tin, Sn, for an Ni/Si alloy, it is necessary to provide about 10 atom % of silicon, Si, for an Ni/Y alloy it is necessary to provide about 3 atom % of yttrium, Y.

However, as mentioned above, it may also be chosen to add to the nickel an amount of additive less than that which would be necessary to completely eliminate its ferromagnetism, for example in order to limit the manufacturing cost of the target and/or to limit any reduction in functionality of the alloyed nickel oxide layer obtained.

A subject of the invention is also the process for manufacturing a thin layer based on alloyed nickel oxide, which is optionally hydrated and/or hydroxylated and/or protonated and/or nitride-treated, and which uses the technique of magnetic-field-assisted cathodic sputtering in an oxidizing reactive atmosphere, from the target described above.

A subject of the invention is also the use of this process to manufacture an anodic electrochromic material as a thin layer based on the said oxide.

A subject of the invention is also the electrochemical device comprising at least one carrier substrate fitted with a stack of functional layers including at least one electrochemically active layer, which is capable of reversibly and simultaneously inserting ions such as $H^+$, $Li^+$ and $OH^-$ and electrons, the said layer being based on the said oxide.

This oxide may be obtained from targets whose composition has been defined in the four variants outlined above. It may be noted moreover that, as a general rule, the atomic proportion of the additive(s) relative to the nickel in the alloy of the target is generally in the region of the atomic proportion of the additive relative to the nickel in the layer of oxide obtained from the target under consideration.

It has been found that the addition of an additive according to the invention to the nickel target has an impact on the structure of the oxide layer obtained from the target in question. It appears that the presence of the additive disfavours the crystallization of the nickel oxide: layers that are mainly amorphous are thus obtained, with small crystal "grains", which has been verified most particularly for the additives of the type W, Si and Li. By approximating their shape to a sphere, these grains have diameters generally of less than 50 nm and in particular of at least 2 to 3 nm. It is advantageous to have a larger amorphous phase and/or smaller crystal grains than in the case of standard nickel oxides, since it is above all the amorphous part of the layer, rather than its crystalline part, which is active in an electrochemical device exploiting the electrochromic properties of nickel oxide. The layers according to the invention do not therefore in principle have a sheet structure with an intercalation compound of the Li type between the sheets, but rather an overall amorphous structure with a homogeneous distribution as grains.

The layer may be based on nickel oxide which is optionally hydrated/hydroxylated and/or nitride treated, alloyed with at least one additive whose oxide is an anodic electrochromic material, such as Ir, Ru or Rh, or alloyed with at least one metal whose oxide is a cathodic electrochromic material, such as Mo, W, Re, Sn, In or Bi, or alloyed with at least one alkaline-earth metal or semiconductor whose hydrated and/or hydroxylated oxide is a proton conductor, such as Ta, Zn, Zr, Al, Sb, U, Mg, La or Y. Finally, it may be alloyed with an additive whose oxide is hygroscopic, for instance an alkali metal such as Li, Na, K, Rb or Cs.

It should be noted here that the term "alloyed" has the following meaning: the additive in question is combined with the nickel oxide in oxide form. This oxide may be in the form of a matrix formed from microdomains of nickel oxide, within which are microdomains based on the oxide of the additive in question. The system may also be a true mixed oxide, in which nickel atoms are replaced with atoms of the additive in question.

Preferred embodiments are $NiSi_xO_y$, $NiAl_xO_y$, $NiSn_xO_y$, $NiW_xO_y$, $NiZn_xO_y$, $NiTa_xO_y$ and $NiY_xO_y$.

It may also be noted that the layers obtained may be hydrated and/or hydroxylated and/or protonated and/or nitride-treated, and that the control of the degree of hydration, protonation and/or hydroxylation and/or nitride treatment of the layer is achieved in particular by appropriately adjusting the cathodic sputtering deposition parameters, for example by adapting the composition of the reactive atmosphere during the deposition (as was envisaged in particular for the layers of electrolyte in patent EP-A-0 831 360). The reactive atmosphere may in particular contain a certain amount of molecules at least one of the atoms of which is nitrogen.

Finally, a subject of the invention is also the use of these electrochemical devices in order for them to form a part of electrochromic glazing. This glazing may equip buildings as exterior glazing or internal partitions or in glazed doors. It may also equip any means of locomotion such as trains, boats, aeroplanes, cars or vans, as side windows, sunroofs, etc. It may also be used in display screen glazing, for instance computer or television screens or touch screens, in spectacles, objectives of photographic equipment, and solar panel protections. It can also be used as a mirror, for example to make anti-glare rear-view mirrors for vehicles (by sufficiently thickening one of the electrically conductive layers and/or by adding an opacifying coating). It can also be used to make energy storage devices such as cells and batteries.

Other advantageous details and characteristics of the invention will emerge below from various non-limiting embodiments.

The examples which follow are of so-called "all-solid" electrochromic glazing.

COMPARATIVE EXAMPLE 1

The glazing has the following sequence:
Glass[1]/$SrO_2$:F[2]/$NiO_xH_y$[3]/$WO_3$[4]/$Ta_2O_5$[5]/$H_xWO_3$[6]/ITO[7] 4 mm/300 nm 200 nm 100 nm 100 nm 250 150 nm The glass (1) is a standard clear silicon-sodium-calcium plane glass, The layer (2) made of fluorine-doped tin oxide is the first transparent electrically conductive layer obtained in a known manner by CVD, The layer (3) made of $NiO_xH_y$ is the counterelectrode, the anodic electrochromic material of the system, obtained by cathodic sputtering in the presence of an $Ar/O_2H_2$ reactive atmosphere from a nickel target containing about 99.95 atom % of nickel;

The layer (4) made of $WO_3$ and (5) made of $Ta_2O_5$ forming the electrolyte are deposited in a known manner by cathodic sputtering from the target made of W and of Ta, (in particular in accordance with the teaching of patent EP-A-0 867 752);

The layer (6) made of $H_xWO_3$ is the layer of cathodic electrochromic material. It is deposited in a known manner by reactive sputtering from a tungsten target;

The layer (7) made of tin-doped indium oxide is the second transparent electrically conductive layer, also deposited in a known manner by cathodic sputtering from an alloy target made of indium and tin.

This glazing functions by proton transfer from one electrochromic layer to the other, by changing the potential difference generated across the glazing in an appropriate manner.

The layer (3) made of $NiO_xH_y$ is obtained with difficulty. Its deposition rate is only 4 nm·m/minute. The target is not worn uniformly (its degree of wear is less than 5%).

EXAMPLE 2 ACCORDING TO THE INVENTION

This consists in replacing the layer (3) made of $NiO_xH_y$ with a layer 3a made of $NiSi_zO_xH_y$, 250 nm thick, obtained by cathodic sputtering in an $Ar/O_2/H_2$ reactive atmosphere from an Ni/Si alloy target with an atomic proportion of about 10% Si relative to Ni+Si.

EXAMPLE 3 ACCORDING TO THE INVENTION

This consists in replacing the layer (3) made of $NiO_xH_y$ with a layer 3b made of $NiW_zO_xH_y$ 250 nm thick, obtained as above but from an Ni/W alloy target with an atomic proportion of W of about 7% relative to Ni+W.

Table 1 below indicates the deposition rates v of the layers based on nickel oxide obtained in accordance with the three examples above, these rates being expressed in nm·m/minutes (for a deposition at 3.5 W/cm²):

TABLE 1

|  | v |
| --- | --- |
| Comparative Example 1 | 4 |
| Example 2 | 20 |
| Example 3 | 25 |

The glasses coated with the layers described above are provided with power supplies connected in a known manner to a voltage generator. They are then laminated with a second glass identical to the first via a sheet of polyurethane 1.25 mm thick.

The three laminated glazing samples were then subjected to a colourization/decolourization cycle (colourization by applying a voltage of about −1.2 V across, and decolourization by applying a voltage of about 0.8 V across). The light transmission values $T_L$ in %, of a* and b* in the colorimetry system (L, a*, b*) in light transmission, and the energy transmission values $T_E$ in % (reference for the $T_L$ measurements; illuminant $D_{65}$) were then measured, when the glazing samples are coloured ("colourization") and then decolorized ("decolourization"). Table 2 below collates all these data for the three glazing samples:

TABLE 2

|  |  | $T_L$ | a* | b* | $T_E$ |
|---|---|---|---|---|---|
| Example 1 | colourization | 13.6% | −3.8 | −2.9 | 10.2% |
|  | decolourization | 80.0% | −2.4 | 7.2 | 67.2% |
| Example 2 | colourization | 14.3% | −3.5 | −3.0 | 11.2% |
|  | decolourization | 79.2% | −2.9 | 5.4 | 66.8% |
| Example 3 | colourization | 12.2% | −3.0 | −3.5 | 9.8% |
|  | decolourization | 80.5% | −2.3 | 5.6 | 67.9% |

From these data it is possible to verify that the changes made to the electrochromic material based on nickel oxide do not affect its performance qualities: the light transmission ranges and energy transmission ranges achieved with Examples 2 and 3 according to the invention are virtually identical to those of Comparative Example 1, and the colorimetric appearance in transmission is not significantly modified either. On the other hand, the rates of deposition of the layers based on nickel oxide according to the invention are at least five times as high as the rate of deposition of a standard layer based on nickel oxide.

The invention claimed is:

1. An electrochemical device, comprising:
   at least one carrier substrate fitted with a stack of functional layers comprising at least one electrochemically active layer, which is capable of reversibly and simultaneously inserting ions and electrons, wherein said electrochemically active layer is based on amorphous alloyed nickel oxide comprised of crystal gains having a diameter of not more than 50 nm that is prepared by magnetic, field-assisted cathodic sputtering employing a nickel based target in an oxidizing atmosphere, the material which is alloyed with the nickel oxide being selected from the group consisting of Ir, Ru, Rh, Mo, Re, In, Bi, Ta, Zn, Zr, Al, Si, Sb, U, Be, Mg, Ca and Y.

2. An electrochemical device according to claim 1, wherein the layer based on nickel oxide is in the form of $NiSi_xO_y$, $NiAl_xO_y$, $NiZn_xO_y$, $NiTa_xO_y$ or $NiY_xO_y$.

3. An electrochemical device, comprising:
   at least one carrier substrate fitted with a stack of functional layers comprising at least one electrochemically active layer, that is capable of reversibly and simultaneously inserting ions and electrons, wherein said electrochemically active layer is based on amorphous alloyed nickel oxide comprised of crystal grains having a diameter of not more than 50 nm that is optionally hydrated, hydroxylated, protonated, nitride treated or a combination thereof, and that is alloyed with at least one element in a minor amount in the alloy in the form of a metal whose oxide is in an anodic electrochemical material, selected from at least one metal of the group consisting of Ir, Ru and Rh.

4. A method of fabricating an electrochemical device comprising at least one carrier substrate fitted with a stack of functional layers comprising at least one least one electrochemically active layer that is capable of reversibly and simultaneously inserting ions and electrons and is based on amorphous alloyed nickel oxide comprising crystal grains having a diameter of not more than 50 nm, the method comprising:
   magnetic, field-assisted cathodic sputtering employing a nickel based target in an oxidizing atmosphere, wherein the material which is alloyed with the nickel oxide is selected from the group consisting of Ir, Ru, Rh, Mo, Re, In, Bi, Ta, Zn, Zr, Al, Si, Sb, U, Be, Mg, Ca and Y.

5. The method according to claim 4, wherein nickel based target is a Ni/Si alloy target and the layer based on nickel oxide is in the form of $NiSi_xO_y$.

6. The method according to claim 4, wherein nickel based target is a Ni/Al alloy target and the layer based on nickel oxide is in the form of $NiAl_xO_y$.

7. The method according to claim 4, wherein nickel based target is a Ni/Zn alloy target and the layer based on nickel oxide is in the form of $NiZn_xO_y$.

8. The method according to claim 4, wherein nickel based target is a Ni/Ta alloy target and the layer based on nickel oxide is in the form of $NiTa_xO_y$.

9. The method according to claim 4, wherein nickel based target is a Ni/Y alloy target and the layer based on nickel oxide is in the form of $NiY_xO_y$.

10. A method of fabricating an electrochemical device comprising at least one carrier substrate fitted with a stack of functional layers comprising at least one least one electrochemically active layer that is capable of reversibly and simultaneously inserting ions and electrons, is based on amorphous alloyed nickel oxide comprising crystal grains having a diameter of not more than 50 nm, and is optionally hydrated, hydroxylated, protonated, nitride treated or a combination thereof, the method comprising:
    magnetic, field-assisted cathodic sputtering employing a nickel based target in an oxidizing atmosphere, wherein at least one element in a minor amount in the amorphous alloyed nickel oxide is at least one metal selected from the group consisting of Ir, Ru and Rh whose oxide is an anodic electrochemical material.

11. The method according to claim 10, wherein the element is Ir.

12. The method according to claim 10, wherein the element is Ru.

13. The method according to claim 10, wherein the element is Rh.

* * * * *